US009857903B2

(12) United States Patent
Lee

(10) Patent No.: US 9,857,903 B2
(45) Date of Patent: Jan. 2, 2018

(54) IN-CELL OLED TOUCH DISPLAY STRUCTURE WITH HIGH LIGHT PENETRATION RATE

(71) Applicant: SuperC-Touch Corporation, New Taipei (TW)

(72) Inventor: Hsiang-Yu Lee, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 5 days.

(21) Appl. No.: 15/285,153

(22) Filed: Oct. 4, 2016

(65) Prior Publication Data
US 2017/0024046 A1 Jan. 26, 2017

Related U.S. Application Data

(62) Division of application No. 14/452,981, filed on Aug. 6, 2014, now Pat. No. 9,507,474.

(30) Foreign Application Priority Data

Aug. 7, 2013 (TW) .............................. 102214789 U

(51) Int. Cl.
| | | |
|---|---|---|
| G06F 3/041 | (2006.01) | |
| G02F 1/1333 | (2006.01) | |
| G06F 3/044 | (2006.01) | |
| H01L 27/32 | (2006.01) | |
| G02F 1/1343 | (2006.01) | |

(Continued)

(52) U.S. Cl.
CPC ........ G06F 3/0412 (2013.01); G02F 1/13338 (2013.01); G02F 1/134309 (2013.01); G02F 1/136286 (2013.01); G06F 3/044 (2013.01);
G06F 3/0416 (2013.01); G09G 3/3225 (2013.01); G09G 3/3648 (2013.01); H01L 27/323 (2013.01); H01L 27/3248 (2013.01); H01L 27/3262 (2013.01); H01L 27/3276 (2013.01); G02F 1/1368 (2013.01); G02F 1/133512 (2013.01);
(Continued)

(58) Field of Classification Search
CPC ...... G06F 3/044; G06F 3/0412; G06F 3/0416; G02F 1/13338
USPC ......................................................... 345/173
See application file for complete search history.

(56) References Cited

U.S. PATENT DOCUMENTS 6,753,654 B2 * 6/2004 Koyama ................ C09K 11/06
315/169.1
8,963,145 B2 * 2/2015 Lee ........................ G06F 3/0412
257/40

(Continued)

*Primary Examiner* — Yuzhen Shen
(74) *Attorney, Agent, or Firm* — Muncy, Geissler, Olds & Lowe, P.C.

(57) ABSTRACT

An in-cell touch display structure includes: an upper substrate, a lower substrate, a liquid crystal layer configured between the upper and lower substrates; a black matrix layer, and a thin film transistor and sensing electrode layer. The thin film transistor and sensing electrode layer includes a gate line sub-layer having a plurality of gate lines and a plurality of connection segments separated by the gate lines, and a source line sub-layer having a plurality of source lines and a plurality of sensing conductor segments separated by the source lines, wherein part of the sensing conductor segments and part of the connection segments are electrically connected together to form a plurality of sensing conductor blocks.

7 Claims, 11 Drawing Sheets

(51) Int. Cl.
*G02F 1/1362* (2006.01)
*G09G 3/3225* (2016.01)
*G09G 3/36* (2006.01)
*G02F 1/1335* (2006.01)
*G02F 1/1368* (2006.01)

(52) U.S. Cl.
CPC ............ *G02F 2001/133302* (2013.01); *G02F 2201/123* (2013.01); *G06F 2203/04103* (2013.01)

(56) References Cited

U.S. PATENT DOCUMENTS

| | | | |
|---|---|---|---|
| 9,412,796 B2* | 8/2016 | Lee | H01L 27/323 |
| 2010/0123680 A1* | 5/2010 | Lee | G06F 3/0412 |
| | | | 345/174 |
| 2013/0113780 A1* | 5/2013 | Miyatake | G06F 3/0412 |
| | | | 345/212 |
| 2014/0062943 A1* | 3/2014 | Choi | G06F 3/0412 |
| | | | 345/174 |
| 2014/0225838 A1* | 8/2014 | Gupta | G06F 3/0412 |
| | | | 345/173 |
| 2015/0049050 A1 | 2/2015 | Zhao | |
| 2015/0130751 A1* | 5/2015 | Teraguchi | G02F 1/13338 |
| | | | 345/174 |
| 2015/0268762 A1 | 9/2015 | Wang | |

* cited by examiner

IN-CELL OLED TOUCH DISPLAY STRUCTURE WITH HIGH LIGHT PENETRATION RATE

CROSS REFERENCE TO RELATED APPLICATION

This application is a divisional application of U.S. patent application Ser. No. 14/452,981, filed on Aug. 6, 2014, which claims the benefits of the Taiwan Patent Application Serial Number 102214789, filed on Aug. 7, 2013, the subject matter of which is incorporated herein by reference.

BACKGROUND OF THE INVENTION

1. Field of the Invention

The present invention relates to a display screen structure with a touch panel and, more particularly, to an in-cell touch display structure.

2. Description of Related Art

Modern consumer electronic apparatuses are typically equipped with touch panels for use as their input devices. According to different sensing manners, the touch panels can be classified into resistive type, capacitive type, acoustic type, and optical type.

The conventional touch display panel includes a touch panel and a display unit overlapped with the touch panel. The touch panel is configured as an operation interface. The touch panel is transparent so that an image generated by the display unit can be viewed directly by a user without being sheltered by the touch panel. Such well known skill of the touch panel may increase additional weight and thickness of the touch display panel, and may further reduce the light penetration rate, and increase reflectance and haze of the touch display panel.

On-cell and in-cell touch technology were invented to overcome the drawbacks of traditional touch technology described above. The on-cell technology is to dispose a sensor on the back side of a color filter substrate to form a completed color filter substrate. One of the on-cell touch technologies is provided to dispose a touch sensor on a thin film and then bond the thin film onto the upper one of the two substrates.

The in-cell technology is to dispose the sensor within the LCD cell structure. Currently, there are resistive, capacitive and optical three primary in-cell touch technologies, wherein the resistive touch technology employs two conductive substrates and the voltage variation of a common layer between the two substrates for determining a touch position on the touch display panel.

The in-cell touch technology is provided to integrate the touch sensor within the display unit so that the display unit is provided with the ability of the touch panel. Therefore, the touch display panel does not need to be bonded with an additional touch panel so as to simplify the assembly procedure. Such skill is generally developed by TFT LCD manufactures.

There is older touch control technology known as out-cell, which is typically applied to the resistive and capacitive touch panels. The out-cell touch technology is provided to add a touch module onto a display module. The touch module and the display module can be manufactured by the two separated parties.

However, for all the in-cell, on-cell and out-cell touch technologies, they all need a sensing layer made of ITO material to be configured on an upper or lower glass substrate, which not only increases the manufacturing cost but also complicates the manufacturing process. Moreover, due to a low aperture rate, strong backlight is required, resulting in higher power consumption, which is disadvantageous in developing mobile devices with low power consumption. Therefore, it desired for the aforementioned touch display panel structure to be improved.

SUMMARY OF THE INVENTION

The object of the present invention is to provide an in-cell touch display panel structure for not only significantly increasing the light penetration rate but also greatly saving the material cost and processing cost. Because there is no need to provide a sensing electrode layer made of ITO material on the upper substrate or lower substrate of a display panel, the manufacturing cost can be reduced and the manufacturing process can be simplified.

In one aspect of the present invention, there is provided an in-cell touch display structure, which comprises: an upper substrate; a lower substrate parallel to the upper substrate; a liquid crystal layer configured between the upper substrate and the lower substrate; a black matrix layer arranged on one side of the upper substrate facing the liquid crystal layer, the black matrix layer being composed of a plurality of opaque lines; and a thin film transistor and sensing electrode layer arranged on one side of the lower substrate facing the liquid crystal layer, wherein the thin film transistor and sensing electrode layer includes: a gate line sub-layer having a plurality of gate lines arranged in a first direction and a plurality of connection segments arranged in a second direction, the plurality of connection segments arranged in the second direction being separated by the plurality of gate lines; and a source line sub-layer disposed at one side of the gate line sub-layer facing the liquid crystal layer and having a plurality of source lines arranged in the second direction and a plurality of sensing conductor segments arranged in the first direction, the plurality of sensing conductor segments arranged in the first direction being separated by the plurality of source lines, wherein part of the sensing conductor segments and part of the connection segments are electrically connected together to form a plurality of sensing conductor blocks arranged in the first direction.

In another aspect of the present invention, there is provided an in-cell touch display structure, which comprises: an upper substrate; a lower substrate parallel to the upper substrate; an OLED layer configured between the upper substrate and the lower substrate; a thin film transistor and sensing electrode layer arranged on one side of the lower substrate facing the OLED layer for driving a corresponding pixel driving circuit based on a display pixel signal and a display driving signal, wherein the thin film transistor and sensing electrode layer includes: a gate line sub-layer having a plurality of gate lines arranged in a first direction and a plurality of connection segments arranged in a second direction, wherein the plurality of connection segments arranged in the second direction are separated by the plurality of gate lines; and a source line sub-layer disposed at one side of the gate line sub-layer facing the liquid crystal layer and having a plurality of source lines arranged in the second direction and a plurality of sensing conductor segments arranged in the first direction, wherein the plurality of sensing conductor segments arranged in the first direction are separated by the plurality of source lines; a cathode layer disposed at one side of the upper substrate facing the OLED layer, the cathode layer being formed with metal material; and an anode layer disposed at one side of the thin film transistor and sensing electrode layer facing the OLED layer and having a plurality of anode pixel electrodes, each connected to a source/drain of a pixel driving transistor of the corresponding pixel driving circuit, wherein part of the sensing conductor segments and part of the connection segments are electrically connected together to form a plurality of sensing conductor blocks arranged in the first direction.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
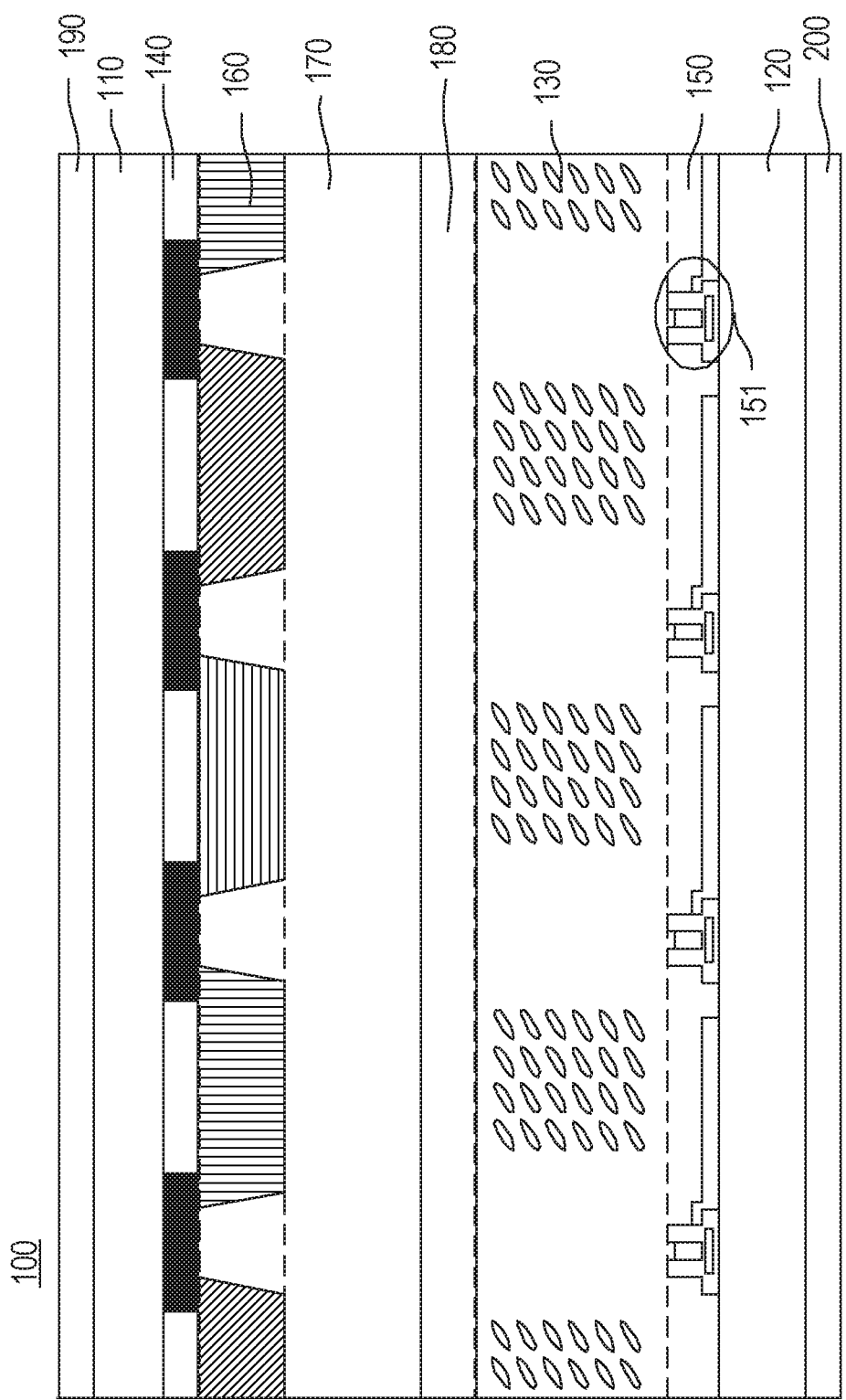
FIG. 1 schematically illustrates an in-cell touch display structure in accordance with one embodiment of the present invention.

With reference to FIG. 1, there is shown an in-cell touch display structure in accordance with one embodiment of the present invention. As shown, the in-cell touch display structure 100 includes an upper substrate 110, a lower substrate 120, a liquid crystal layer 130, a black matrix layer 140, a thin film transistor and sensing electrode layer 150, a color filter layer 160, an over coat layer 170, a common electrode (Vcom) layer 180, a first polarizer layer 190, and a second polarizer layer 200.

The upper substrate 110 and the lower substrate 120 are preferably glass substrates, and are parallel to each other. The liquid crystal layer 130 is disposed between the upper and lower substrates 110, 120.

The black matrix layer 140 is between the upper substrate 110 and liquid crystal layer 130 and is disposed at one side of the upper substrate 110 that faces the liquid crystal layer 130. The black matrix layer 140 is composed of a plurality of opaque lines.

Figure 2:
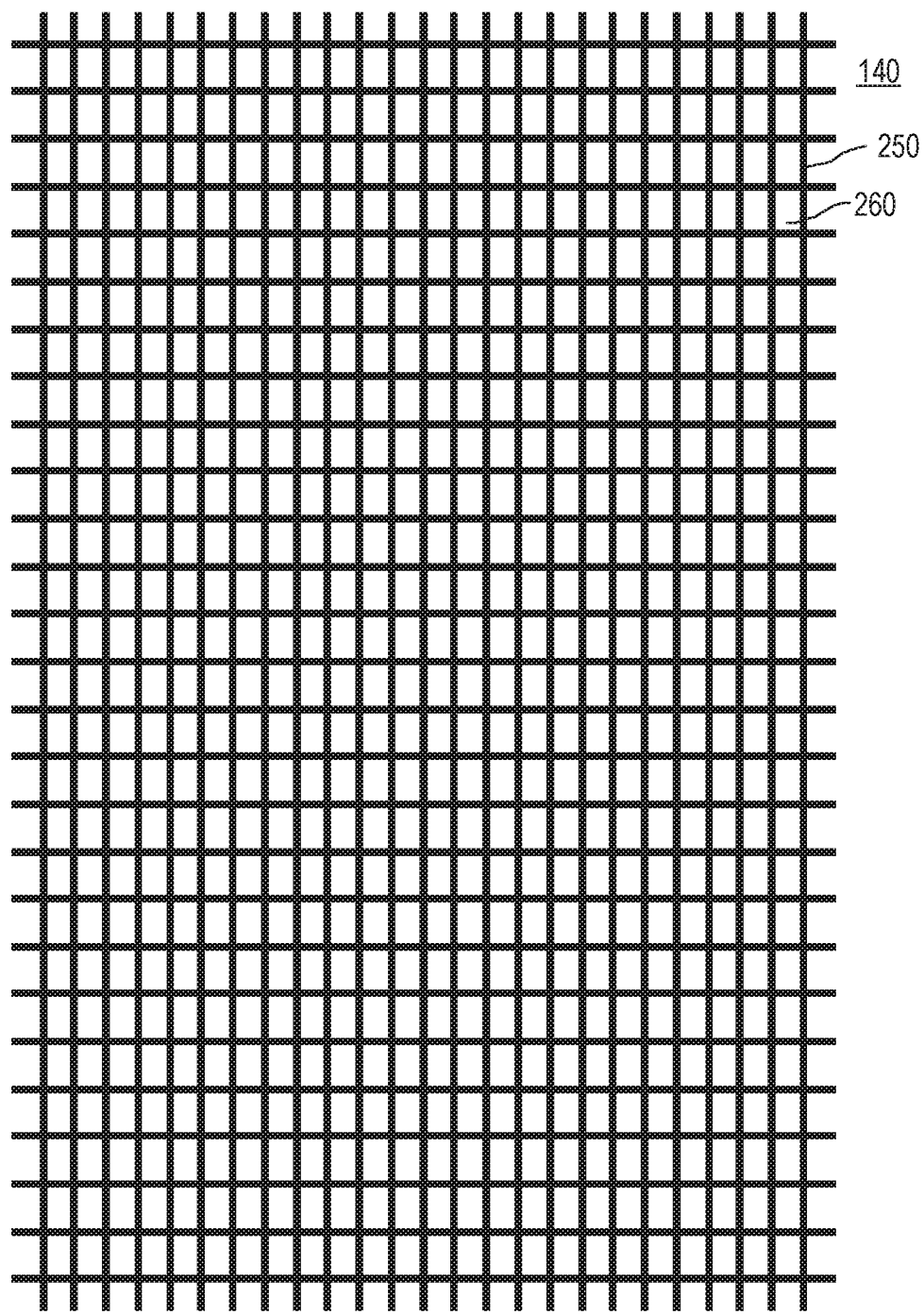
FIG. 2 shows the black matrix layer of the in-cell touch display structure in accordance with the present invention.

FIG. 2 shows the black matrix layer 140, which is the same as that of the prior LCD panel. As shown in FIG. 2, the black matrix layer 140 is composed of a plurality of opaque lines 250 of insulating material that are black and opaque. The plurality of lines 250 of black insulating material are arranged as a checkerboard pattern and the color filter is disposed at the spaces 260 among those opaque lines 250 of black insulating material.

In prior LCD panel structure, the thin film transistor layer is between the lower substrate and the liquid crystal layer and is disposed at one surface of the lower substrate that faces the liquid crystal layer. The prior thin film transistor layer is composed of thin film transistors and transparent electrodes.

In the present invention, a plurality of sensing conductor segments and a plurality of connection segments are provided on the prior thin film transistor layer and part of the plurality of sensing conductor line segments is electrically connected to part of the plurality of connection segments to form a plurality of sensing conductor blocks arranged in a first direction (X-axis direction), and a plurality of source lines are provided to form a plurality of sensing conductor lines arranged in a second direction (Y-axis direction), thereby forming the thin film transistor and sensing electrode layer 150 in accordance with the present invention. Therefore, there is no need to arrange a sensing electrode layer on the upper glass substrate or the lower glass substrate of an LCD display panel, so as to reduce the manufacturing cost, simplify the manufacturing process and increase the yield rate. The thin film transistor and sensing electrode layer 150 is between the lower substrate 120 and the liquid crystal layer 130 and is disposed at one surface of the lower substrate 120 that faces the liquid crystal layer 130. Furthermore, the thin film transistor and sensing electrode layer 150 includes a gate line sub-layer and a source line sub-layer.

Figure 3:
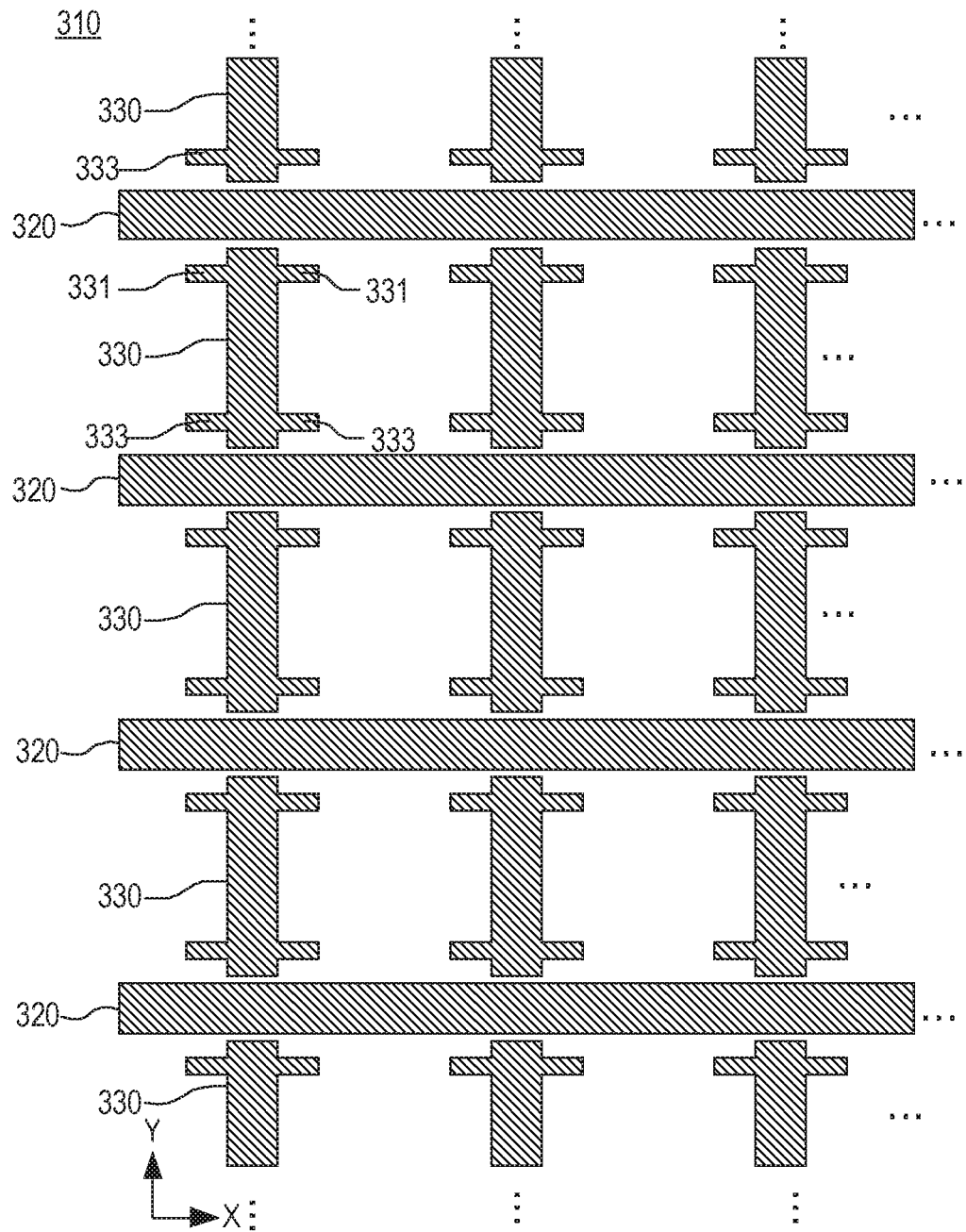
FIG. 3 schematically illustrates the gate line sub-layer of the in-cell touch display structure in accordance with the present invention.

FIG. 3 schematically illustrates the gate line sub-layer 310 in accordance with the present invention. The gate line sub-layer 310 has a plurality of gate lines 320 and a plurality of connection segments 330. The plurality of gate lines 320 are arranged in the first direction (X-axis direction) and the plurality of connection segments 330 are arranged in the second direction (Y-axis direction), wherein the plurality of connection segments 330 arranged in the second direction are separated by the plurality of gate lines 320. Each of the plurality of connection segments 330 arranged in the second direction includes two ends respectively having a first extension part 331 and a second extension part 333 arranged in the first direction and extended toward two sides of the connection segment 330, in which the first direction is substantially vertical to the second direction.

Figure 4:
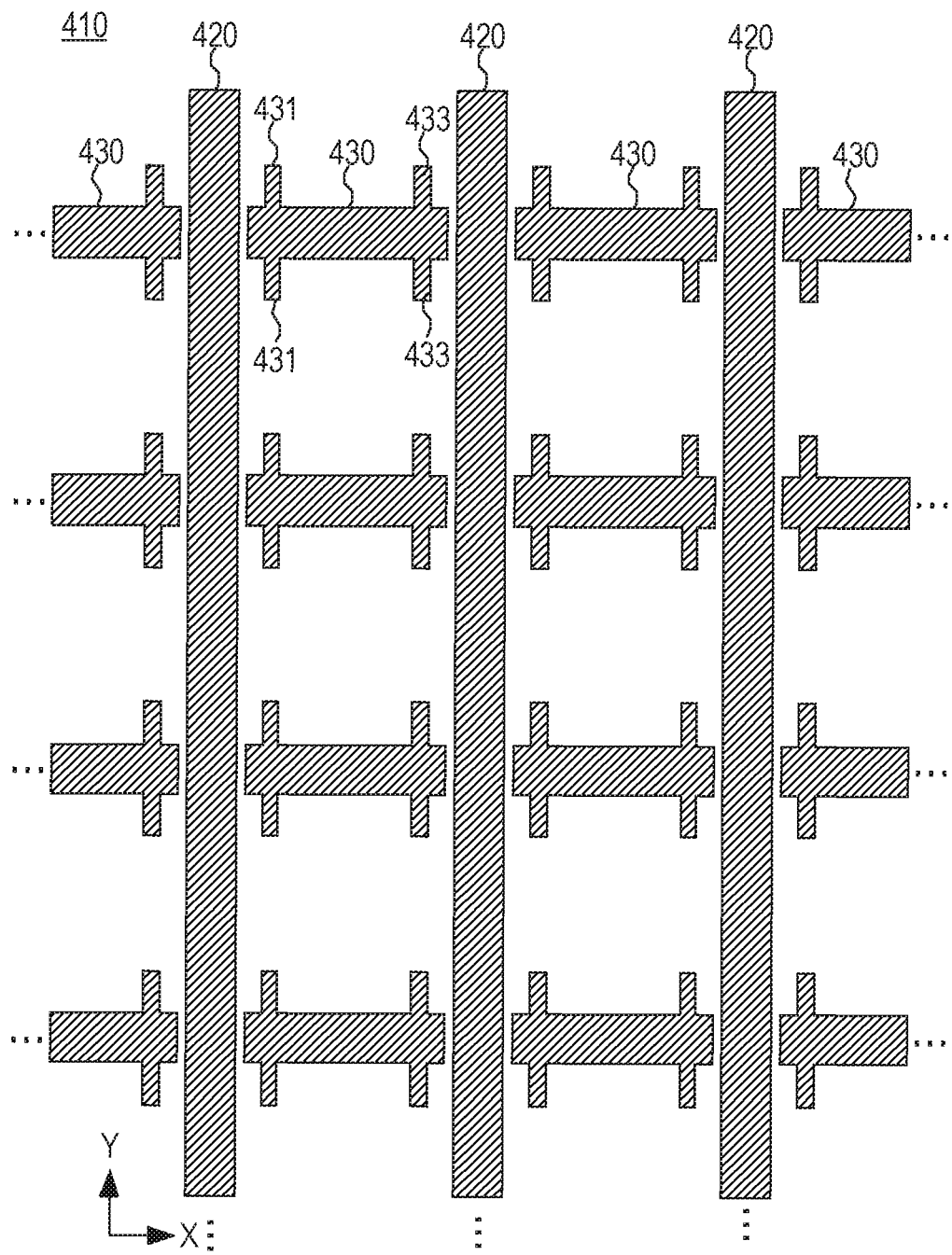
FIG. 4 schematically illustrates the source line sub-layer of the in-cell touch display structure in accordance with the present invention.

FIG. 4 schematically illustrates the source line sub-layer 410 in accordance with the present invention. The source line sub-layer 410 is disposed at one side of the gate line sub-layer 310 facing the liquid crystal layer 130 and has a plurality of source lines 420 and a plurality of sensing conductor segments 430. The plurality of source lines 420 are arranged in the second direction (Y-axis direction) and the plurality of sensing conductor segments 430 are arranged in the first direction (X-axis direction), wherein the plurality of sensing conductor segments 430 arranged in the first direction are separated by the plurality of source lines 420. Each of the plurality of sensing conductor segments 430 arranged in the first direction includes two ends respectively having a first extension part 431 and a second extension part 433 arranged in the second direction (Y-axis direction) and extended toward two sides of the sensing conductor segment 430.

The plurality of sensing conductor segments 430 and the plurality of connection segments 330 are disposed at positions corresponding to the positions of the plurality of gate lines 320 and the plurality of source lines 420. Part of the sensing conductor segments 430 and part of the connection segments 330 are electrically connected by overlapping and electrically connecting the extension parts 331, 333, 431, 433 selectively, so as to form a plurality of sensing conductor blocks, as shown in FIG. 5, arranged in the first direction, wherein each sensing conductor block is a mesh-like quadrangular region and the quadrangular region is preferably of a rectangle.

Figure 5:
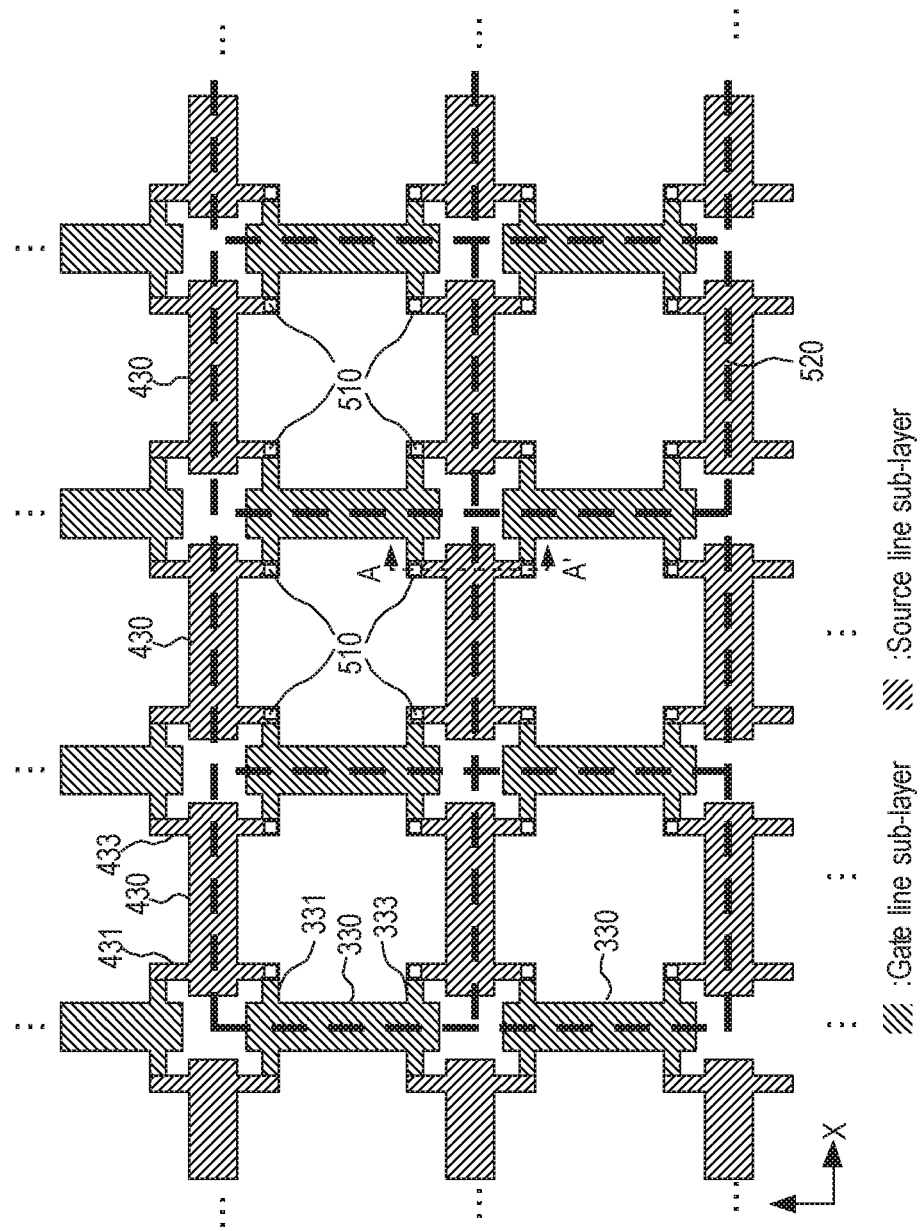
FIG. 5 schematically illustrates the electrical connection between the plurality of sensing conductor segments and the plurality of connection segments in accordance with the present invention.

FIG. 5 schematically illustrates the electrical connection between the plurality of sensing conductor segments 430 and the plurality of connection segments 330. The sensing conductor segments 430 and the connection segments 330 are disposed at different layers, respectively, wherein the extension parts 331, 333, 431, 433 are partially overlapped and electrically connected through via 510, so as to form a plurality of sensing conductor blocks 520 arranged in the first direction.

The plurality of sensing conductor segments 430 and the plurality of connection segments 330 are made of conductive metal material, wherein the conductive metal material is selectively to be chromium, barium, aluminum, silver, copper, titanium, nickel, tantalum, cobalt, tungsten, magnesium, calcium, potassium, lithium, indium, or a mixture of LiF, MgF2 or Li2O.

Figure 6:
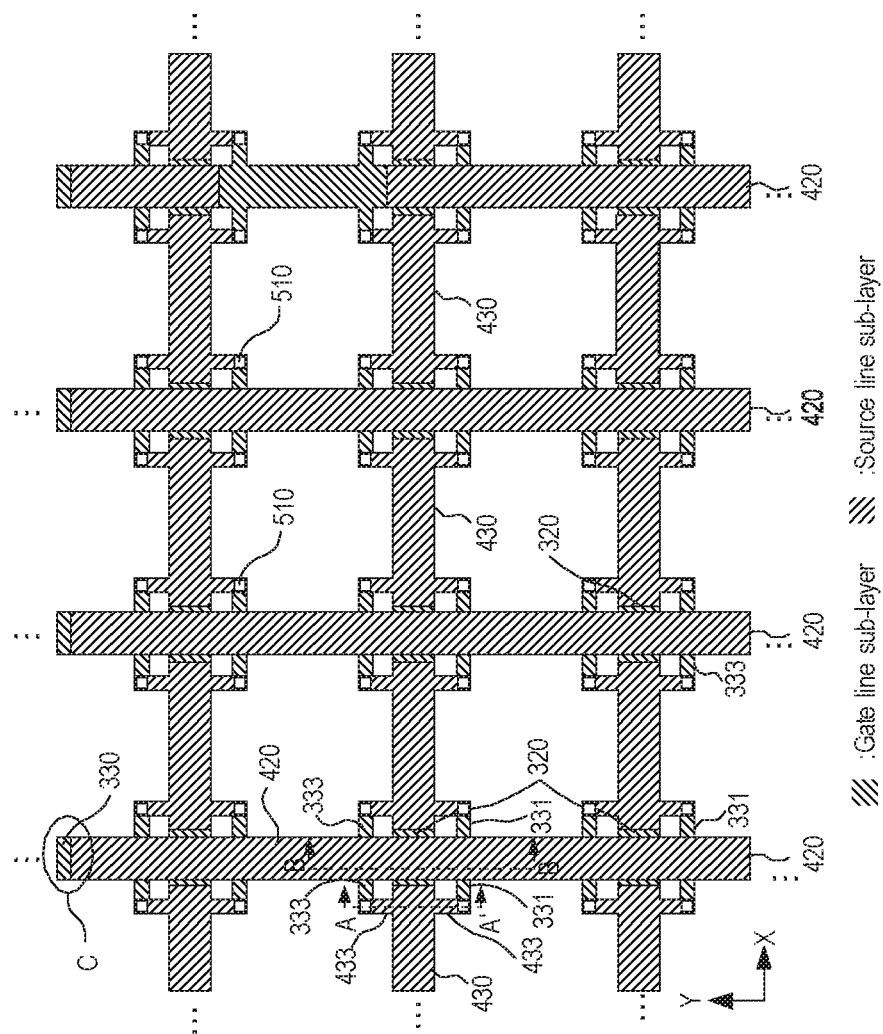
FIG. 6 schematically illustrates the electrical connection between the gate line sub-layer and the source line sub-layer in accordance with the present invention.

FIG. 6 schematically illustrates the electrical connection between the gate line sub-layer 310 and the source line sub-layer 410, which is viewed from the upper substrate 110 to the lower substrate 120. It is noted that, the ellipse C is employed to label the connection segments 330 arranged in the second direction, which are actually not visible in the direction from the upper substrate 110 to the lower substrate 120.

As shown in FIG. 6, the line width of the sensing conductor segment 430 arranged in the first direction is equal to the line width of the gate line 320, and the line width of the connection segment 330 arranged in the second direction is equal to the line width of the source line 420. In a typical LCD display or the present display structure, the plurality of opaque lines 250 of the black matrix layer 140 are disposed at positions corresponding to the positions of the plurality of gate lines 320 and the plurality of source lines 420, so that the plurality of opaque lines 250 of the black matrix layer 140 can shield the plurality of gate lines 320 and the plurality of source lines 420. In other embodiments, the line width of the sensing conductor segment 430 arranged in the first direction can be smaller than the line width of the gate line 320, and the line width of the plurality of connection segment 330 arranged in the second direction can be smaller than the line width of the source line 420.

In the present invention, the plurality of connection segments 330 arranged in the second direction are disposed at positions same as the positions of the source lines 420 but on different layers. Similarly, the plurality of sensing conductor segments 430 arranged in the first direction are disposed at positions same as the positions of the gate lines 320 but on different layers. In the prior art, the gate lines and the source lines are disposed below the opaque lines. In the present invention, the plurality of connection segments 330 arranged in the second direction and the plurality of sensing conductor segments 430 arranged in the first direction are disposed at positions corresponding to the positions of the plurality of gate lines 320 and the plurality of source lines 420. That is, the plurality of opaque lines 250 of the black matrix layer 140 are disposed at positions corresponding to the positions of the plurality of gate lines 320 and the plurality of source lines 420. Therefore, the plurality of connection segments 330 arranged in the second direction and the plurality of sensing conductor segments 430 arranged in the first direction are also shielded by the plurality of opaque lines 250.

Figure 7A:
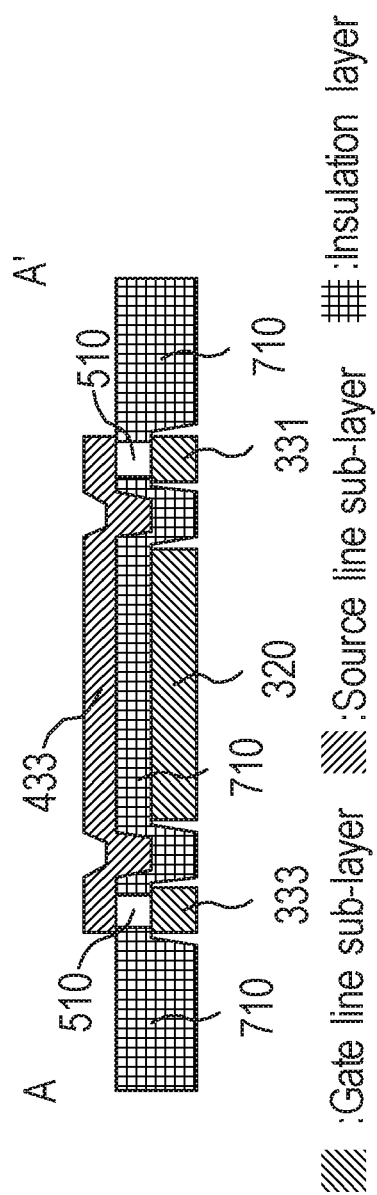
FIG. 7A and FIG. 7B are two cross sectional views taking along A-A' and B-B' lines of FIG. 6, respectively.
Figure 7B:
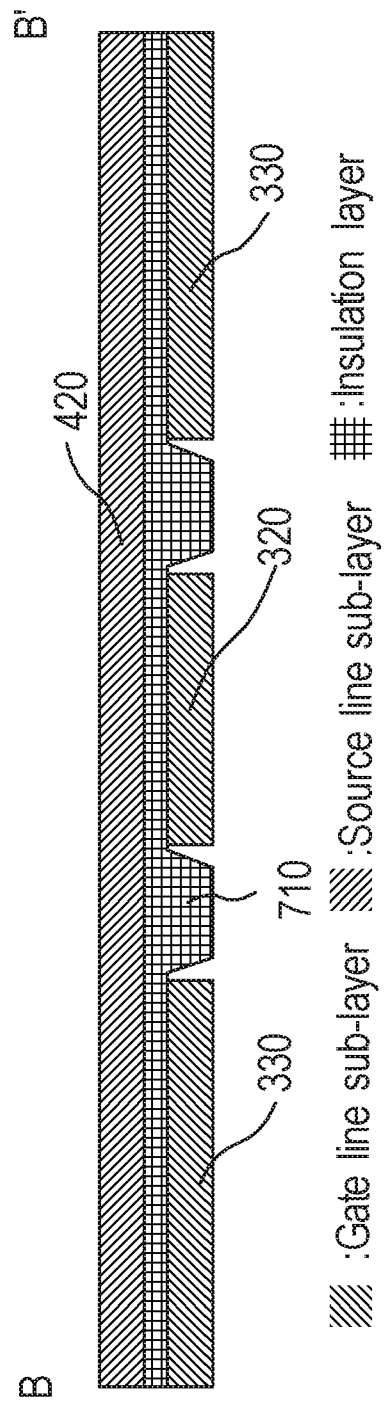

FIG. 7A and FIG. 7B are two cross sectional views taking along A-A' and B-B' lines of FIG. 6, respectively. As shown in FIG. 7A, there is an insulation layer 710 arranged between the gate line 320 and the second extension part 433 arranged in the second direction. The second extension part 433 arranged in the second direction is electrically connected to the first extension part 331 arranged in the first direction and the second extension part 333 arranged in the first direction through vias 510. There is an insulation layer 710 arranged between the gate line 320 and the source line 420.

From FIGS. 3, 4, 5, 6, 7A and 7B, it is known that the plurality of sensing conductor segments arranged in the first direction and the plurality of connection segments arranged in the second direction can form the plurality of sensing conductor blocks 520 arranged in the first direction. Further, with the plurality of source lines 420 used as a plurality of sensing conductor lines arranged in the second direction, it is able to form a touch pattern with the sensing conductor blocks arranged in the first direction and the sensing conductor lines arranged in the second direction, so as to detect finger's touch.

Figure 8:
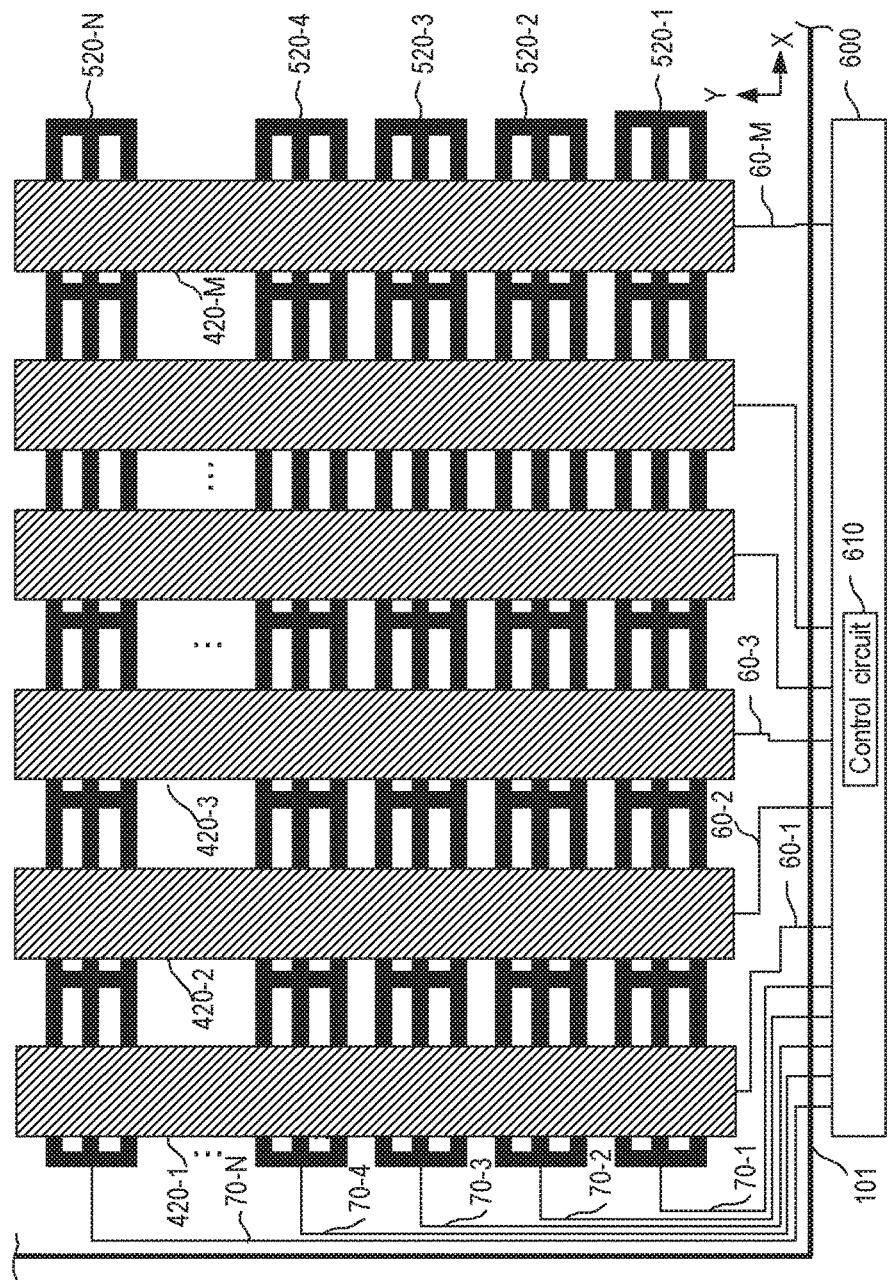
FIG. 8 schematically illustrates the sensing conductor of the present invention.

FIG. 8 schematically illustrates the sensing conductor of the present invention, which includes a plurality of sensing conductor blocks 520 arranged in the first direction and a plurality of source lines 420 arranged in the second direction. The plurality of source lines 420-1, 420-2, ..., 420-M arranged in the second direction are extended to one edge 101 of the in-cell touch display structure 100 through the wires 60-1, 60-2, ..., 60-M, and further connected to the control circuit 610 of a flexible circuit board 600. The plurality of sensing conductor blocks 520-1, 520-2, ..., 520-N arranged in the first direction are extended to the edge 101 of the in-cell touch display structure 100 through the wires 70-1, 70-2, ..., 70-N, and further connected to the control device 610 of the flexible circuit board 600.

Because the plurality of sensing conductor segments 430 and the plurality of connection segments 330 are disposed at positions corresponding to the positions of the gate lines 320 and source lines 420, the sensing conductor blocks 520-1, 520-2, ..., 520-N formed thereby are disposed at positions corresponding to the gate lines 320 and the source lines 420, and thus can be shielded by the plurality of opaque lines 250. As a result, the light penetration rate is not influenced.

Each of the sensing conductor blocks 520-1, 520-2, ..., 520-N is formed with a mesh-like quadrangular region, wherein the slender metal sensing lines in each quadrangular region are electrically connected with each other while any two quadrangular regions are not connected with each other.

The control device 610 is connected to the plurality of gate lines 320, the plurality of source lines 420, and the plurality of sensing conductor blocks 520 arranged in the first direction. In sensing, the control device 610 provides touch driving signals for detecting whether there is an external object approached through the plurality of source lines 420 and the sensing conductor blocks 520 arranged in the first direction. In displaying, the control device 610 provides display pixel signals and display driving signals for driving corresponding pixel transistors and pixel capacitors through the plurality of gate lines 320 and the plurality of source lines 420, so as to perform a display operation.

Because the present invention makes use of the plurality of source lines 420 to form the plurality of sensing conductor lines arranged in the second direction, and the source lines are also used for providing pixel data in displaying, a multiplexing scheme is required. That is, in sensing, the plurality of source lines 420 are the sensing conductor lines arranged in the second direction, and the plurality of source lines 420 and the sensing conductor blocks 520 arranged in the first direction are provided to detect whether there is an external object approached or touched based on a touch driving signal. In displaying, the plurality of gate lines 320 and the plurality of source lines 420 are provided to drive corresponding pixel transistors and pixel capacitors based on a display pixel signal and a display driving signal, thereby performing a display operation.

Figure 9:
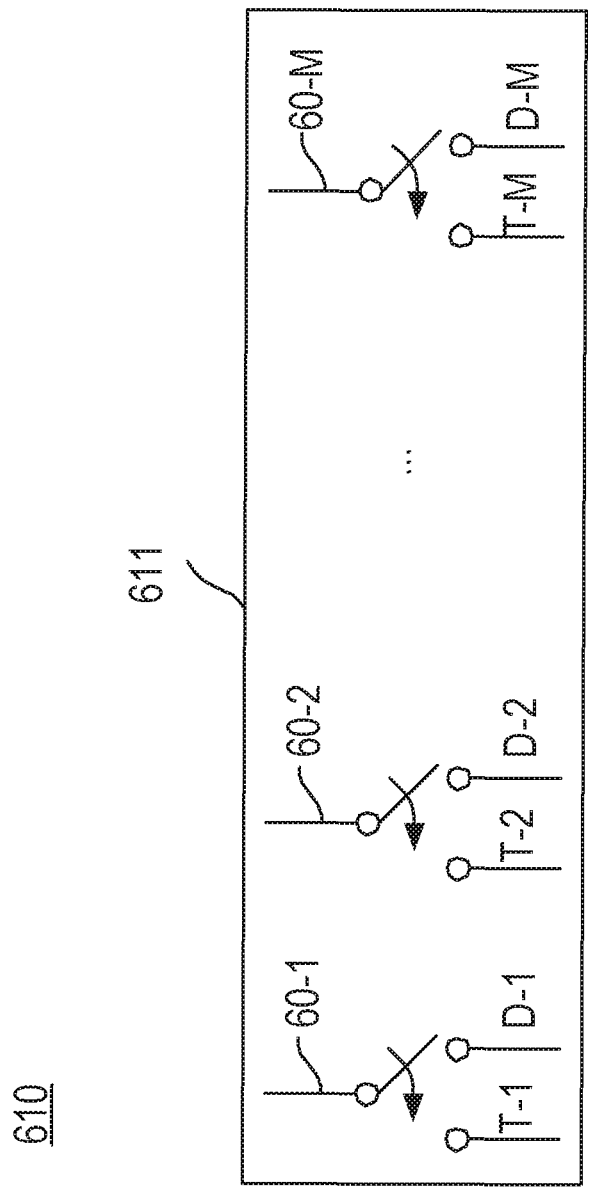
FIG. 9 is a schematic diagram of the multiplexing unit in accordance with the present invention.

The control device 610 has a multiplexing unit 611 for providing the touch driving signals to the plurality of source lines 420 in sensing, and providing the display pixel signals to the plurality of source lines 420 in displaying. FIG. 9 is a schematic diagram of the multiplexing unit 611 in accordance with the present invention. In displaying, the switches are switched to positions D (D-1, D-2, . . . , D-M) for providing the display pixel signal to the plurality of source lines 420 through the wires 60-1, 60-2, . . . , 60-M. In sensing, the switches are switched to positions T (T-1, T-2, . . . , T-M) for providing the touch driving signal to the plurality of source lines 420 through the wires 60-1, 60-2, . . . , 60-M.

Figure 10:
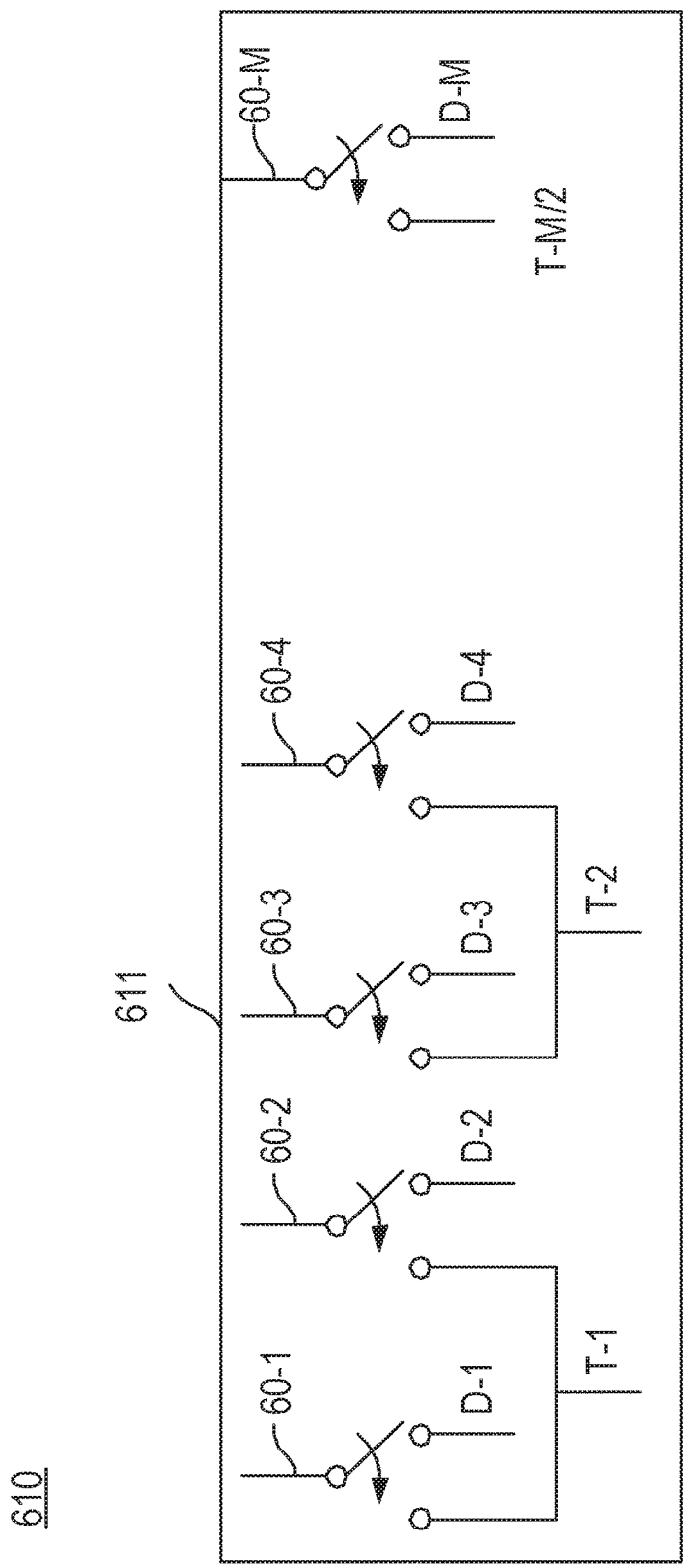
FIG. 10 is another schematic diagram of the multiplexing unit in accordance with the present invention.

FIG. 10 is another schematic diagram of the multiplexing unit 611 in accordance with the present invention, which is similar to FIG. 9 except that, in sensing, the wires 60-1 and 60-2, the wires 60-3 and 60-4, . . . and the wires 60-(M−1) and 60-M are respectively electrically connected together, so that the corresponding source line 420 may obtain a sensing signal with a stronger signal strength.

The color filter layer 160 is arranged on one side of the black matrix layer 140 that faces the liquid crystal layer 130. The common electrode layer 180 is disposed between the upper substrate 110 and the lower substrate 120. The first polarizer layer 190 is arranged on one side the upper substrate 110 opposite to the other side of the upper substrate 110 facing the liquid crystal layer 130. The second polarizer layer 200 is arranged on one side of the lower substrate 120 opposite to the other side of the lower substrate 120 facing the liquid crystal layer 130.

Figure 11:
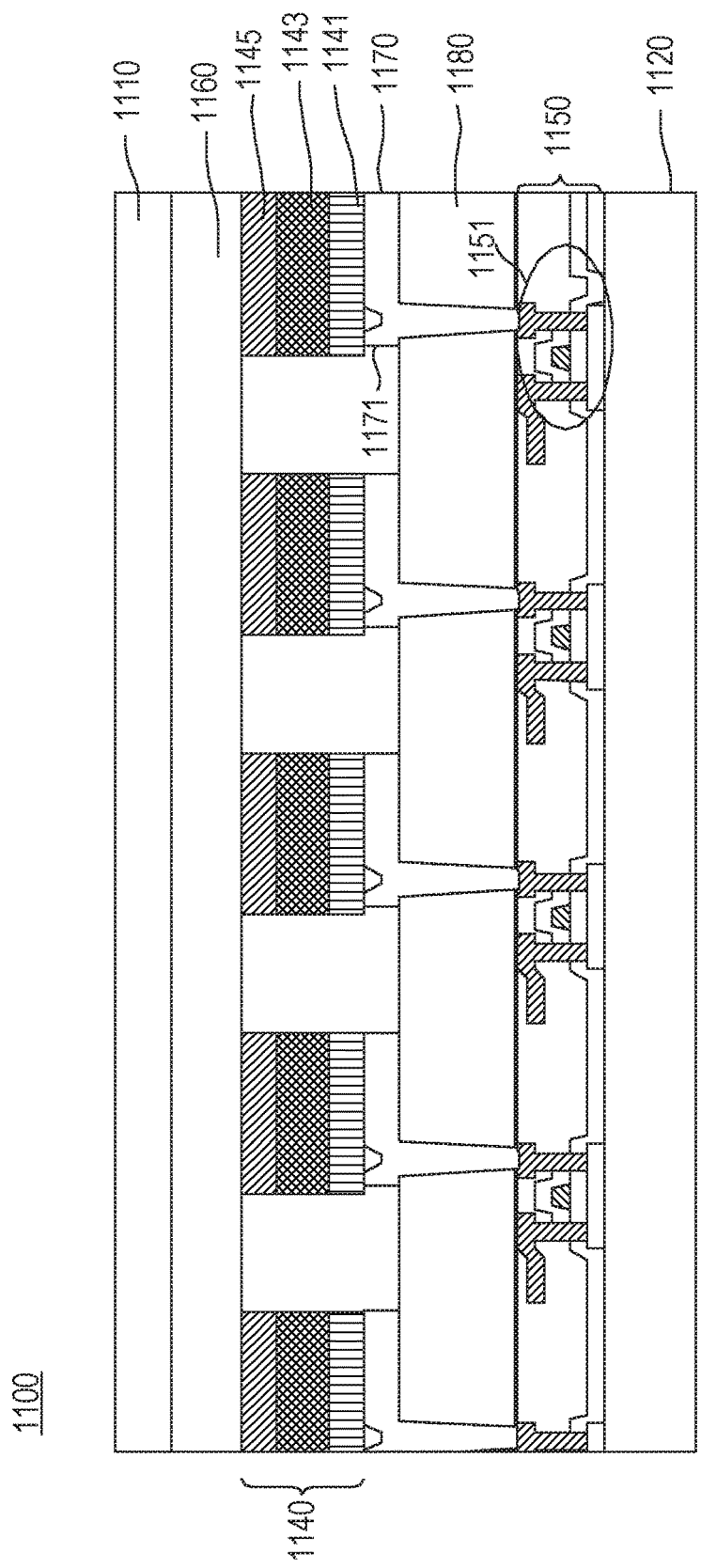
FIG. 11 schematically illustrates an in-cell touch display structure in accordance with another embodiment of the present invention.

FIG. 11 schematically illustrates an in-cell touch display structure in accordance with another embodiment of the present invention. As shown, the in-cell touch display structure 1100 includes an upper substrate 1110, a lower substrate 1120, an organic light emitting diode (OLED) layer 1140, a thin film transistor and sensing electrode layer 1150, a cathode layer 1160, an anode layer 1170, and an insulation layer 1180.

The upper substrate 1110 and the lower substrate 1120 are preferably glass substrates and are parallel to each other. The OLED layer 1140 is disposed between the upper and lower substrates 1110, 1120.

In this embodiment, a plurality of sensing conductor segments 430 and a plurality of connection segments 330 are provided on the prior thin film transistor layer and part of the plurality of sensing conductor line segments 430 is electrically connected to part of the plurality of connection segments 330 to form a plurality of sensing conductor blocks 520 arranged in a first direction (X-axis direction), and a plurality of source lines 420 are provided to form a plurality of sensing conductor lines arranged in a second direction (Y-axis direction), thereby forming the thin film transistor and sensing electrode layer 1150 in accordance with the present invention. Therefore, there is no need to arrange a sensing electrode layer made of transparent material on the upper glass substrate or the lower glass substrate of a display panel, so as to reduce the manufacturing cost, simplify the manufacturing process and increase the yield rate.

The details for the plurality of sensing conductor segments 430 and the plurality of connection segments 330 can be found in the disclosure of the first embodiment and FIGS. 3-10, and thus a detailed description therefor is deemed unnecessary.

The OLED layer 1140 includes a hole transporting layer 1141, an emitting layer 1143, and an electron transporting layer 1145.

The thin film transistor and sensing electrode layer 1150 is disposed on one side of the lower substrate 1120 that faces the OLED layer 1140. The thin film transistor and sensing electrode layer 1150 includes a plurality of gate lines (not shown), a plurality of source lines (not shown), a plurality sensing conductor blocks (not shown), and a plurality of pixel driving circuits 1151, each corresponding to a pixel, so as to drive a corresponding pixel driving circuit 1151 based on a display pixel signal and a display driving signal thereby performing a display operation.

According to different designs of the pixel driving circuit 1151, such as 2T1C being a pixel driving circuit formed with two thin film transistors and a storage capacitor, and 6T2C being a pixel driving circuit formed with six thin film transistors and two storage capacitors, the gate of at least one thin film transistor in the pixel driving circuit 1151 is connected to a gate line (not shown). According to different designs of driving circuit, a source/drain of at least one thin film transistor in a control circuit is connected to a source line (not shown) and a source/drain of at least one thin film transistor in pixel driving circuit 1151 is connected to a corresponding anode pixel electrode 1171 of the anode layer 1170.

The anode layer 1170 is disposed at one side of the thin film transistor and sensing electrode layer 1150 facing the OLED layer 1140. The anode layer 1170 includes a plurality of anode pixel electrodes 1171. Each of the anode pixel electrodes 1171 is corresponding to one pixel driving transistor of the pixel driving circuit 1151 of the thin film transistor and sensing electrode layer 1150. That is, each of the anode pixel electrodes 1171 is connected to a source/drain of the pixel driving transistor of the corresponding pixel driving circuit 1151, so as to form a pixel electrode of a specific color, for example a red pixel electrode, a green pixel electrode, or a blue pixel electrode.

The cathode layer 1160 is disposed at one side of the upper substrate 1110 facing the OLED layer 1140 and between the upper substrate 1110 and the OLED layer 1140. The cathode layer 1160 is formed with metal material, preferably metal material with thickness being less than 50 nm. The metal material is selectively to be alloy of aluminum, silver, magnesium, calcium, potassium, lithium, indium, or combination of lithium fluoride, magnesium fluoride, lithium oxide and aluminum. Due to the thickness of the cathode layer 1160 being less than 50 nm, the light generated by the OLED layer 1140 can pass through the cathode layer 1160, so as to show images on the upper substrate 1110. The cathode layer 1160 is intact piece electrical connection, so that it can be used as a shielding. Moreover, the cathode layer 1160 also receives the current coining from the anode pixel electrode 1171.

In the prior art, the electrode pads made of ITO have an average light penetration rate of about 90%. In the present invention, the plurality of sensing conductor blocks 520 arranged in the first direction are disposed at positions corresponding to the positions of the gate lines 320 and the source lines 420, so that the light penetration rate is not influenced. Therefore, the light penetration rate of the present invention is much better than that of the prior art. Accordingly, in comparison with the prior touch display panel, the in-cell touch display structure in accordance with the present invention shall have a higher brightness.

In view of the forgoing, it is known that the present invention is able to form a sensing touch pattern structure arranged in first and second directions on the thin film transistor and sensing electrode layer 150, so that there is no need to manufacture a sensing electrode layer made of ITO material on the upper glass substrate or lower glass substrate of the display panel thereby reducing the manufacturing cost and decreasing the manufacturing process.

Moreover, the plurality of connection segments 330 of the present invention can also be defined on the mask for defining the prior gate lines 320, and the plurality of sensing conductor segments 430 of the present invention can also be defined on the mask for defining the prior source lines 420. Therefore, there is no extra manufacturing process required; i.e., the display panel is provided with touch control function without introducing new process.

Although the present invention has been explained in relation to its preferred embodiment, it is to be understood that many other possible modifications and variations can be made without departing from the spirit and scope of the invention as hereinafter claimed.

What is claimed is:

1. An in-cell OLED touch display structure with high light penetration rate, comprising:
 an upper substrate;
 a lower substrate parallel to the upper substrate;
 an OLED layer configured between the upper substrate and the lower substrate;
 a thin film transistor and sensing electrode layer arranged on one side of the lower substrate facing the OLED layer for driving a corresponding pixel driving circuit based on a display pixel signal and a display driving signal, wherein the thin film transistor and sensing electrode layer includes:
  a gate line sub-layer having a plurality of gate lines arranged in a first direction and a plurality of connection segments arranged in a second direction, wherein the plurality of connection segments arranged in the second direction are separated by the plurality of gate lines; and
  a source line sub-layer disposed at one side of the gate line sub-layer facing the OLED layer and having a plurality of source lines arranged in the second direction and a plurality of sensing conductor segments arranged in the first direction, wherein the plurality of sensing conductor segments arranged in the first direction are separated by the plurality of source lines;
 a cathode layer disposed at one side of the upper substrate facing the OLED layer, the cathode layer being formed with metal material; and
 an anode layer disposed at one side of the thin film transistor and sensing electrode layer facing the OLED layer and having a plurality of anode pixel electrodes, each connected to a source/drain of a pixel driving transistor of the corresponding pixel driving circuit,
 wherein part of the sensing conductor segments and part of the connection segments are electrically connected together to form a plurality of sensing conductor blocks arranged in the first direction,
 wherein the plurality of sensing conductor segments and the plurality of connection segments are disposed at positions corresponding to those of the plurality of gate lines and the plurality of source lines,
 wherein each of the plurality of connection segments arranged in the second direction includes two ends respectively having a first extension part and a second extension part arranged in the first direction, and each of the plurality of sensing conductor segments arranged in the first direction includes two ends respectively having a first extension part and a second extension part arranged in the second direction, at least one of the first extension part and the second extension part of each of the plurality of connection segments and at least one of the first extension part and the second extension part of each of the plurality of sensing conductor segments being partially overlapped, and
 wherein the first extension part and the second extension part of the connection segment are perpendicular to the connection segment, and the first extension part and the second extension part of the sensing conductor segment are perpendicular to the sensing conductor segment.

2. The in-cell OLED touch display structure with high light penetration rate as claimed in claim 1, wherein, in sensing, the plurality of source lines are sensing conductor lines arranged in the second direction, and the plurality of source lines arranged in the second direction and the sensing conductor blocks arranged in the first direction are provided to detect whether there is an external object approached or touched based on a touch driving signal and, in displaying, the plurality of gate lines and the plurality of source lines are provided to drive corresponding anode pixel electrodes based on the display pixel signal and display driving signal, thereby performing a display operation.

3. The in-cell OLED touch display structure with high light penetration rate as claimed in claim 2, wherein the plurality of sensing conductor segments and the plurality of connection segments are made of conductive metal material, and the first direction is perpendicular to the second direction.

4. The in-cell OLED touch display structure with high light penetration rate as claimed in claim 3, wherein the metal material is selectively to be aluminum, silver, magnesium, calcium, potassium, lithium, indium, or a mixture of lithium fluoride, magnesium fluoride, lithium oxide and aluminum.

5. The in-cell OLED touch display structure with high light penetration rate as claimed in claim 4, wherein each of the sensing conductor blocks arranged in the first direction is a mesh-like quadrangular region, and the quadrangular region is of a rectangle.

6. The in-cell OLED touch display structure with high light penetration rate as claimed in claim 5, wherein the plurality of sensing conductor segments arranged in the first direction and the plurality of connection segments arranged in the second direction are provided to form the plurality of sensing conductor blocks arranged in the first direction by electrically connecting part of the plurality of sensing conductor segments and part of the plurality of connection segments.

7. The in-cell OLED touch display structure with high light penetration rate as claimed in claim 6, wherein the OLED layer includes a hole transporting layer, an emitting layer, and an electron transporting layer.

\* \* \* \* \*